United States Patent
Norman

(10) Patent No.: US 9,112,499 B2
(45) Date of Patent: *Aug. 18, 2015

(54) FIELD PROGRAMMABLE GATE ARRAYS USING RESISTIVITY-SENSITIVE MEMORIES

(71) Applicant: Unity Semiconductor Corporation, Sunnyvale, CA (US)

(72) Inventor: Robert Norman, Sunnyvale, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/724,789

(22) Filed: Dec. 21, 2012

(65) Prior Publication Data

US 2013/0222010 A1    Aug. 29, 2013

Related U.S. Application Data

(63) Continuation of application No. 12/932,902, filed on Mar. 8, 2011, now Pat. No. 8,344,756, which is a continuation of application No. 12/657,678, filed on Jan. 25, 2010, now Pat. No. 7,902,868, which is a continuation of application No. 12/006,006, filed on Dec. 29, 2007, now Pat. No. 7,652,502.

(51) Int. Cl.
    *H03K 19/177* (2006.01)
(52) U.S. Cl.
    CPC .......... *H03K 19/177* (2013.01); *H03K 19/1776* (2013.01); *H03K 19/1778* (2013.01); *H03K 19/17772* (2013.01)
(58) Field of Classification Search
    USPC ....................... 326/37–41, 47, 101
    See application file for complete search history.

(56) References Cited

U.S. PATENT DOCUMENTS

| 5,579,258 | A | 11/1996 | Adachi |
| 6,031,391 | A | 2/2000 | Couts-Martin et al. |
| 6,259,271 | B1 * | 7/2001 | Couts-Martin et al. ......... 326/40 |

(Continued)

OTHER PUBLICATIONS

Norman, Robert, U.S. Appl. No. 12/657,678, filed Dec. 13, 2010, re Response dated Dec. 14, 2010 to the Office Action of Dec. 13, 2010. 6 pages.

(Continued)

*Primary Examiner* — Douglas W Owens
*Assistant Examiner* — James H Cho
(74) *Attorney, Agent, or Firm* — Stolowitz Ford Cowger LLP

(57) ABSTRACT

Field programmable gate arrays using resistivity-sensitive memories are described, including a programmable cell comprising a configurable logic, a memory connected to the configurable logic to provide functions for the configurable logic, the memory comprises a non-volatile rewriteable memory element including a resistivity-sensitive memory element, an input/output logic connected to the configurable logic and the memory to communicate with other cells. The memory elements may be two-terminal resistivity-sensitive memory elements that store data in the absence of power. The two-terminal memory elements may store data as plurality of conductivity profiles that can be non-destructively read by applying a read voltage across the terminals of the memory element and data can be written to the two-terminal memory elements by applying a write voltage across the terminals. The memory can be vertically configured in one or more memory planes that are vertically stacked upon each other and are positioned above a logic plane.

3 Claims, 7 Drawing Sheets

(56) References Cited

U.S. PATENT DOCUMENTS

| | | |
|---|---|---|
| 6,316,965 B1 | 11/2001 | Jonker et al. |
| 7,068,069 B2 * | 6/2006 | Fujita ............................... 326/38 |
| 7,154,297 B1 * | 12/2006 | Camarota et al. ................ 326/40 |
| 7,304,493 B2 * | 12/2007 | Goodnow et al. ............... 326/16 |
| 7,327,600 B2 | 2/2008 | Norman |
| 7,593,284 B2 | 9/2009 | Norman |
| 7,688,621 B2 | 3/2010 | Cho et al. |
| 7,715,250 B2 | 5/2010 | Norman |
| 7,812,458 B2 | 10/2010 | Madurawe |
| 7,813,210 B2 | 10/2010 | Norman |
| 7,822,913 B2 | 10/2010 | Norman |
| 7,877,541 B2 | 1/2011 | Norman |
| 8,020,132 B2 | 9/2011 | Norman |
| 2003/0122578 A1 | 7/2003 | Masui et al. |
| 2006/0067115 A1 * | 3/2006 | Gruber et al. .................. 365/171 |
| 2006/0119385 A1 | 6/2006 | Balasubramanian et al. |
| 2007/0120580 A1 * | 5/2007 | Kim et al. ....................... 326/93 |
| 2008/0005459 A1 | 1/2008 | Norman |
| 2008/0084727 A1 | 4/2008 | Norman |
| 2009/0164203 A1 | 6/2009 | Norman |
| 2009/0164744 A1 | 6/2009 | Norman |
| 2009/0172350 A1 | 7/2009 | Norman |

OTHER PUBLICATIONS

Norman, Robert, U.S. Appl. No. 12/006,006, filed Dec. 29, 2007, Notice of Allowance and Fee(s) Due mailed Nov. 30, 2009. 11 pages.

Norman, Robert, U.S. Appl. No. 12/006,006, filed Dec. 29, 2007, Office Action mailed Mar. 5, 2009. 14 pages.

Norman, Robert, U.S. Appl. No. 12/006,006, filed Dec. 29, 2007, Office Action mailed Jul. 9, 2009. 6 pages.

Norman, Robert, U.S. Appl. No. 12/006,006, filed Dec. 29, 2007, Response dated Jul. 9, 2009 to the Office Action of Jul. 8, 2009. 15 pages.

Norman, Robert, U.S. Appl. No. 12/006,006, filed Dec. 29, 2007, Response dated Mar. 31, 2009 to the Office Action of Mar. 5, 2009. 13 pages.

Norman, Robert, U.S. Appl. No. 12/657,678, filed Dec. 13, 2010, Notice of Allowance and Fee(s) Due mailed Jan. 25, 2011. 10 pages.

Norman, Robert, U.S. Appl. No. 12/657,678, filed Dec. 13, 2010, Office Action mailed Dec. 13, 2010. 13 pages.

* cited by examiner

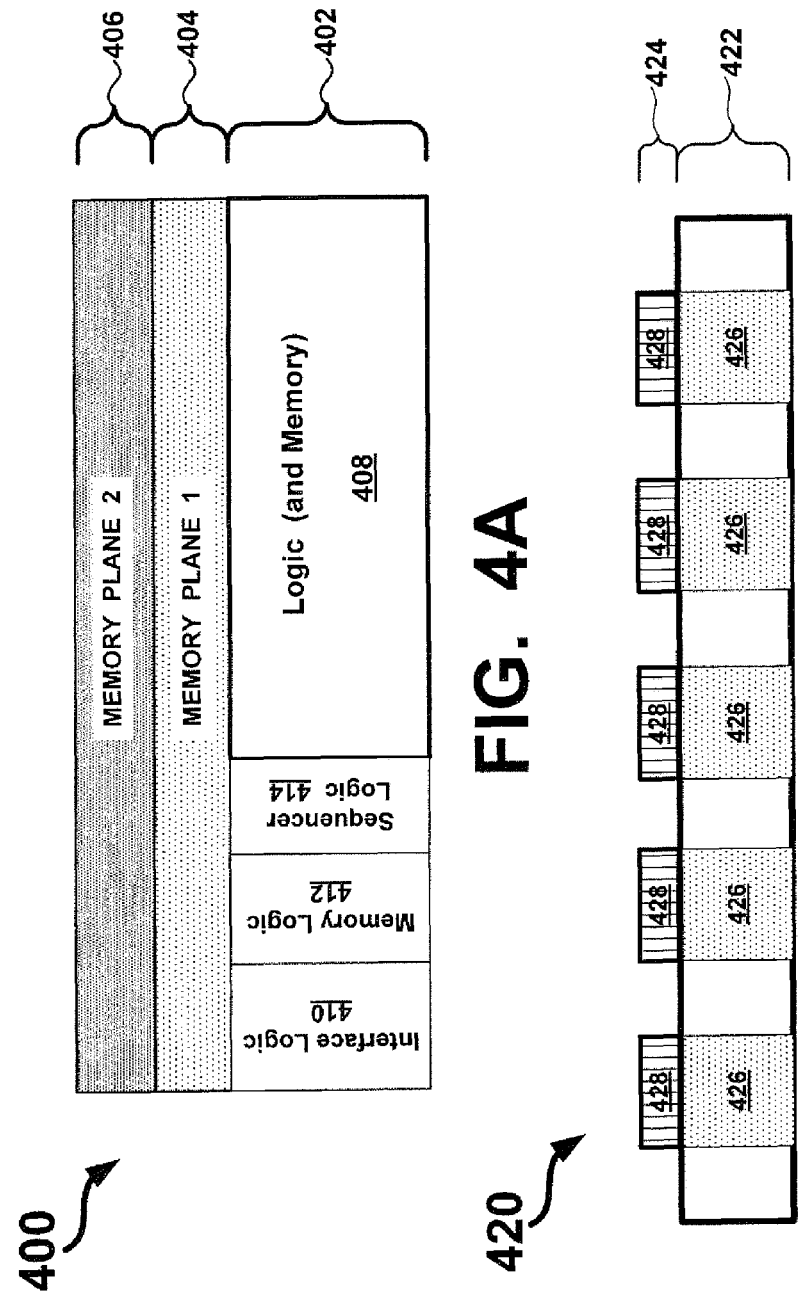

FIELD PROGRAMMABLE GATE ARRAYS USING RESISTIVITY-SENSITIVE MEMORIES

FIELD OF THE INVENTION

The present invention relates to programmable devices and specifically to Field Programmable Gate Arrays Using Resistivity-Sensitive Memories.

BACKGROUND

A field programmable gate array (FPGA) is a programmable logic device that allows a user to design custom logic circuits for desired tasks. A user can create a program for a desired task, transfer the program to an FPGA, and use the programmed FPGA to execute the desired task. Certain FPGAs can be reprogrammable, and allow for flexibility when creating or testing device designs.

FPGAs typically include a memory to provide functions for logic gates for implementing the program. Several different types of memories may be used with an FPGA, including write-once and reprogrammable memories. Write-once memories include memories using fuse technologies, which destroy or establish a physical connection during writing, and therefore cannot be rewritten. Fuse technologies are non-volatile and retain their contents when power is removed from the FPGA, but must be discarded if a new or updated program is desired.

FPGAs may also use reprogrammable memories such as random access memories (RAMs) including static RAMs (SRAMs). SRAMs can be reprogrammed, but lose their contents when power is removed from the FPGA. Since SRAMs are volatile, FPGAs incorporating SRAMs must be booted whenever they are powered up to provide functions to the memories.

There are continued efforts to improve the implementation of FPGAs.

BRIEF DESCRIPTION OF THE DRAWINGS

Various embodiments of the invention are disclosed in the following detailed description and the accompanying drawings. Although the Drawings depict various examples of the invention, the invention is not limited by the depicted examples. Furthermore, the depictions are not necessarily to scale:

FIG. 4A illustrates an FPGA using a vertically configured memory according to an embodiment;

FIG. 4B illustrates an FPGA having vertically configured cell memories according to various embodiments.

DETAILED DESCRIPTION

Figure 1A:
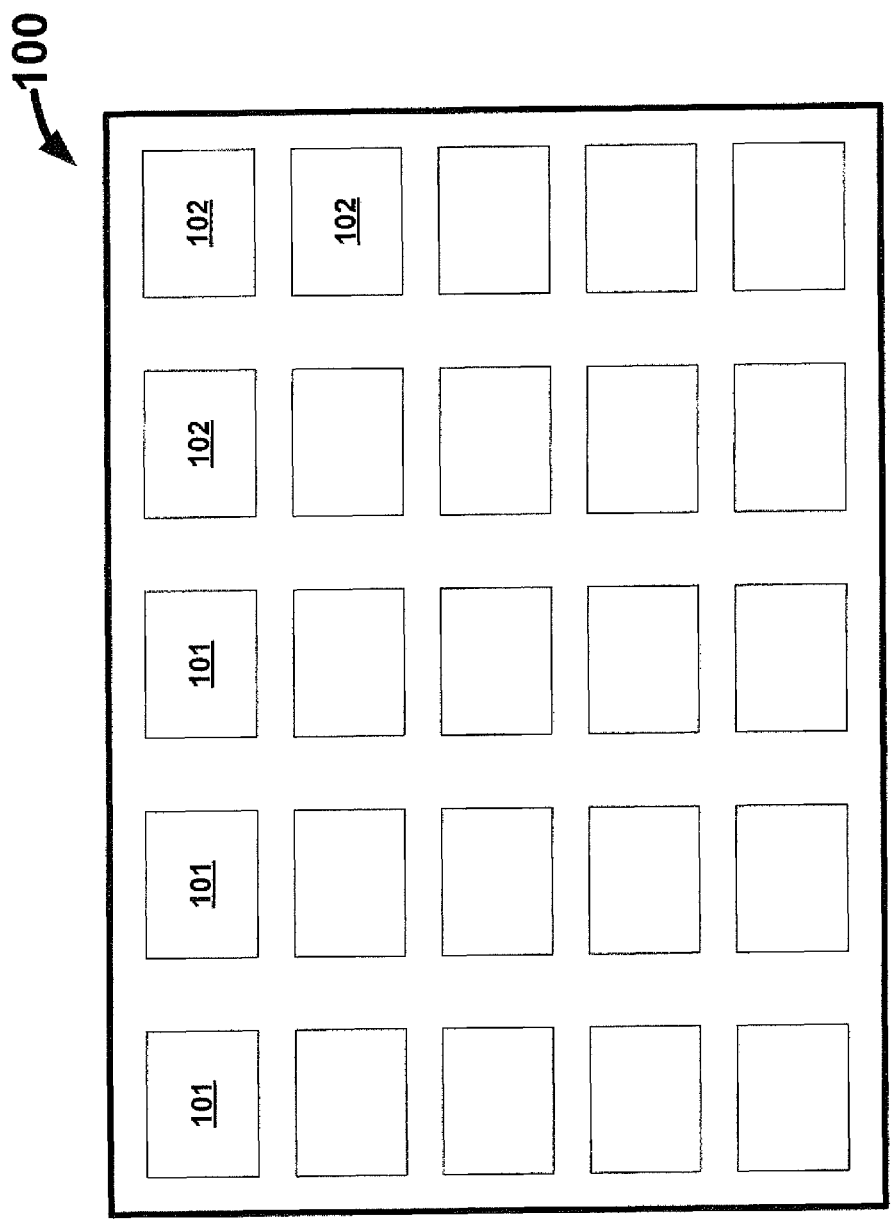
FIG. 1A illustrates a field programmable gate array (FPGA) according to an embodiment.

A detailed description of one or more examples is provided below along with accompanying figures. The detailed description is provided in connection with such examples, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

According to various embodiments, field programmable gate arrays (FPGAs) using non-volatile rewritable memories including a resistivity-sensitive memory element are disclosed. The FPGAs may include one or more programmable cells that include a memory and a configurable logic. The memory may include a resistivity-sensitive memory element that is non-volatile and rewritable. The memory stores functions for the configurable logic. Since the memory is non-volatile, the FPGA retains its contents when power is removed and the FPGA may be powered on without booting. Since the memory is rewritable, the FPGA can be reprogrammed.

Memory Technology

Non-volatile memory technologies may be used with memory systems to develop high density, low cost, and fast access memories. Access may refer to accessing and performing data operations (e.g., read, write, erase) on a memory or memory array, such as those developed by Unity Semiconductor, Inc. of Sunnyvale, Calif., which provide vertically-configured cell arrays (e.g., vertically-stacked, cross-point, two or three-terminal, non-volatile memory arrays) with reduced die sizes and manufacturing costs and system-level functionality. Examples of memory arrays may include vertically-stacked, two or three-terminal, cross-point memory arrays, such as those described in U.S. patent application Ser. No. 11/095,026, filed Mar. 30, 2005, U.S. Published Application No. 2006/0171200, and titled "Memory Using Mixed Valence Conductive Oxides," hereby incorporated by reference in its entirety and for all purposes, describes two terminal memory cells that can be arranged in a cross point array. The application describes a two terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry).

The two-terminal memory elements can be arranged in a cross point array such that one terminal is electrically coupled with an x-direction line and the other terminal is electrically coupled with a y-direction line. A stacked cross point array consists of multiple cross point arrays vertically stacked upon one another, sometimes sharing x-direction and y-direction lines between layers, and sometimes having isolated lines. When a first write voltage $V_{W1}$ is applied across the memory element, (typically by applying $\frac{1}{2} V_{W1}$ to the x-direction line and $\frac{1}{2} -V_{W1}$ to the y-direction line) it switches to a low resistive state. When a second write voltage $V_{W2}$ is applied across the memory element, (typically by applying ½ $V_{W2}$ to the x-direction line and ½–$V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

Fast accesses for data operations may be achieved by using page buffers to allow multiple data operations to be performed substantially simultaneously (i.e., buffering data from a read and a write access). Further, various embodiments of data packet formats and data communication protocols may be used to indicate how data from different data operations (e.g., read, write) may be aligned to allow fast accesses to a memory array.

The memory technology described above therefore comprises a resistivity-sensitive memory element according to an embodiment, which may be a two- or three-terminal memory element. The resistivity-sensitive memory element detects changes in resistance in a memory element as either a 0 or a 1 bit, as is described in the above-referenced U.S. patent. The memory technology is also non-volatile. In other words, when power is removed from the memory, the memory retains its contents. The memory technology requires no refresh, which improves performance over other memory technologies. The memory technology also requires no erase for writes and does not require an operating system (OS), improving performance. Additionally, the memory elements are physically smaller than many other memories, increasing densities leading to smaller sizes and reduced power consumption. The memory arrays can also be stacked on top of one another in a vertical manner for increased density.

A Field Programmable Gate Array

Figure 1B:
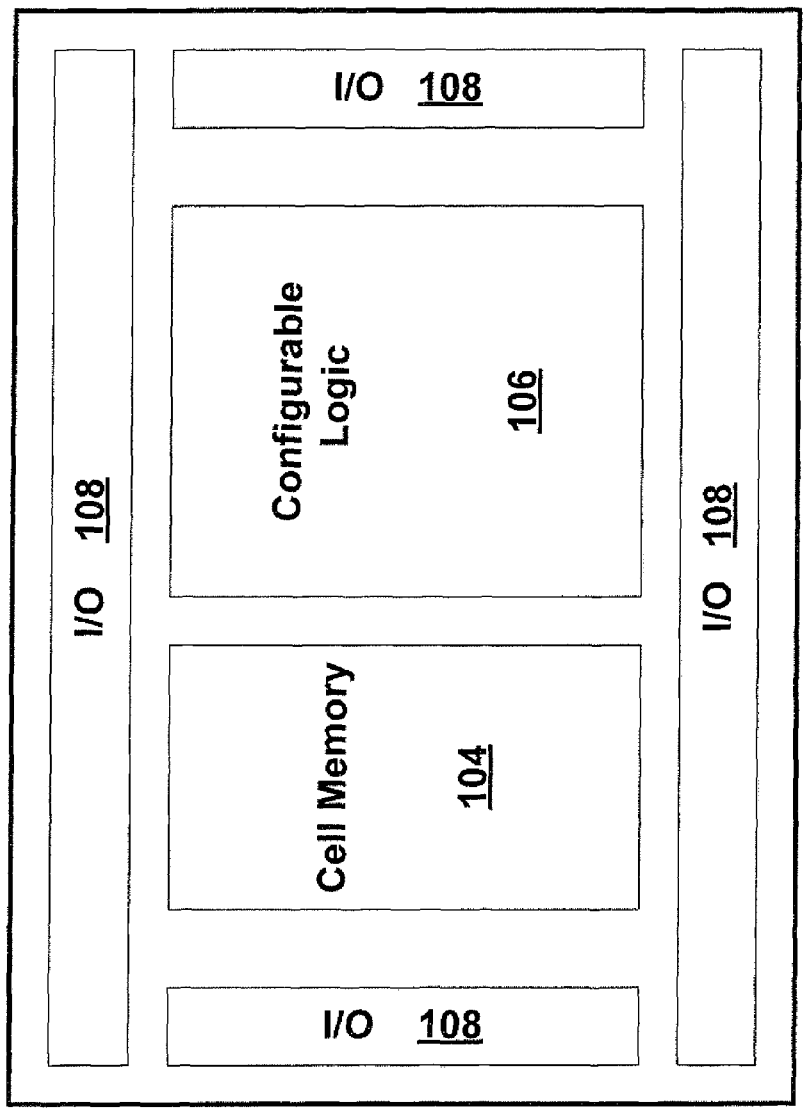
FIG. 1B illustrates a programmable cell according to an embodiment.
Figure 1C:
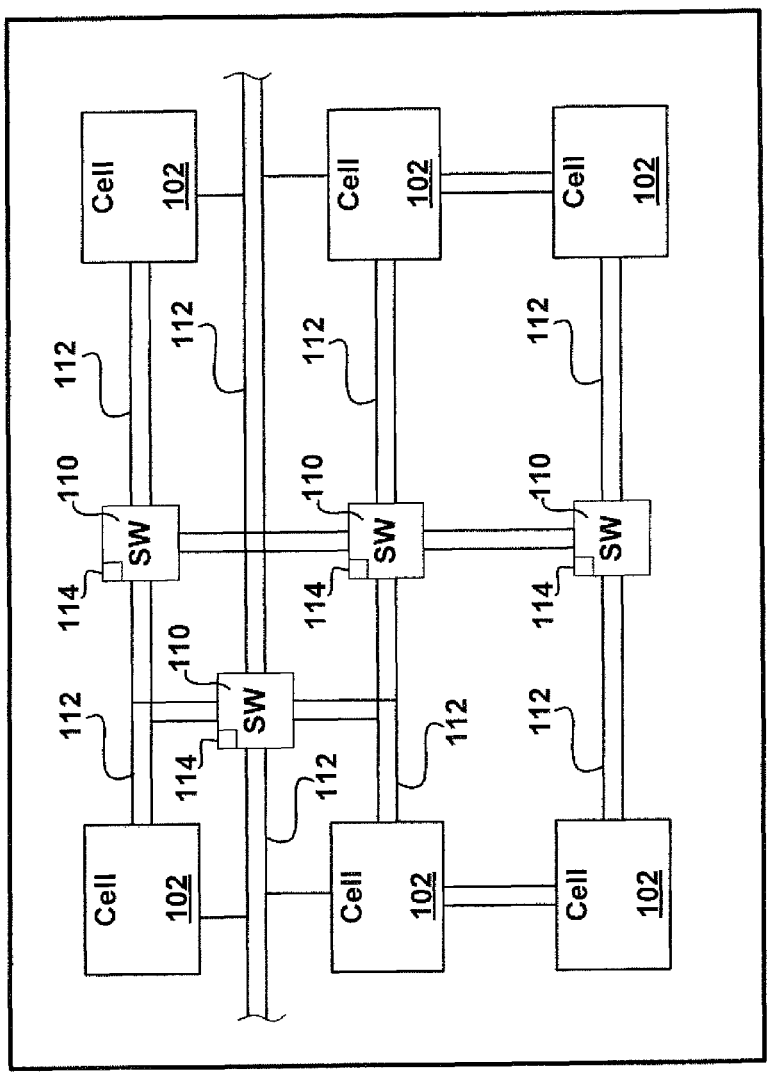
FIG. 1C illustrates signal routing within an FPGA according to an embodiment.

FIGS. 1A-1C illustrate several views of a Field Programmable Gate Array according to various embodiments. An FPGA is a programmable logic device that can be programmed using appropriate software or other programming tools. An FPGA may be programmed to perform a desired function, and may include various components to facilitate that ability. For example, FPGAs may include several interchangeable blocks that may provide a generic function, such as a programmable cell having a set of logic gates. The blocks may then be individually programmed to perform a specific function. The various blocks may have various functions, which, when performed together, result in the execution of the desired task.

According to various embodiments, an FPGA may use the memory technology described above. According to certain embodiments that are explained below, the memory technology may be used as a boot memory that is non-volatile, thereby retaining the programming of the FPGA when power is removed. The boot memory may be used to program a conventional memory (such as a static random access memory (SRAM)) that provides functions for a configurable logic. According to another embodiment, the conventional memory is replaced with the non-volatile rewriteable memory (i.e., a memory including a resistivity-sensitive memory element such as the memory technology described above.) According to this embodiment, the FPGA can be started and be functional without booting.

FIG. 1A illustrates an FPGA according to an embodiment. An FPGA 100 may include a plurality of interconnected macro blocks 101. A block is an individual component that can be incorporated into an FPGA design and may be pre-designed to facilitate the creation of the FPGA. An FPGA may include several different types of blocks, for example memories, processor cores, and logic blocks. A macro block such as one of the macro blocks 101, may be a larger block created from other, smaller blocks. The FPGA 100 includes a plurality of programmable cells 102 that may be macro blocks 101. The programmable cells 102 may be macro blocks of any of various designs and may include logic and memory blocks, as will be explained when discussing FIG. 1B.

FIG. 1B illustrates a programmable cell 102 according to an embodiment. The programmable cell 102 may be a macro block including other blocks such as a cell memory 104, a configurable logic 106, and input/output (I/O) logics 108. These components in combination create a programmable cell 102 that can be programmed with various functions, thereby enabling the FPGA 100. The programmable cell 102 is an example of a macro block for an FPGA; it is understood that various other macro blocks may be created as desired by a user of the FPGA 100.

The cell memory 104 may store functions for the configurable logic 106. The functions may, according to an embodiment, be a look-up table including various functions capable of controlling the configurable logic 106. According to an embodiment, the cell memory 104 may be a non-volatile rewriteable memory including a two-terminal resistivity-sensitive memory element such as the memory technology described above. According to another embodiment, the cell memory 104 may be a volatile memory such as an SRAM.

According to various embodiments, the non-volatile rewritable memory using the memory technology described above may be used to perform memory emulation. In this context, "emulation" refers to using the cell memory 104 to perform the function of one or more previously used memory types. For example, the memory cell 104 may perform the function of a SRAM. In this instance, the memory cell 104 may be said to be performing "SRAM: emulation." However, unlike SRAM which is volatile, the memory cell 104 emulates SRAM and is non-volatile (i.e., stored data is retained in the absence of power).

If the cell memory 104 is a non-volatile rewritable memory, the FPGA 100 can be initially programmed, and thereafter be powered on without booting (i.e., without having to load lookup tables or other functions from an external boot memory). This behavior is hereinafter referred to as "instant-on." Further, the cell memory 104 can be rewritten to change the program of the FPGA 100.

Figure 2:
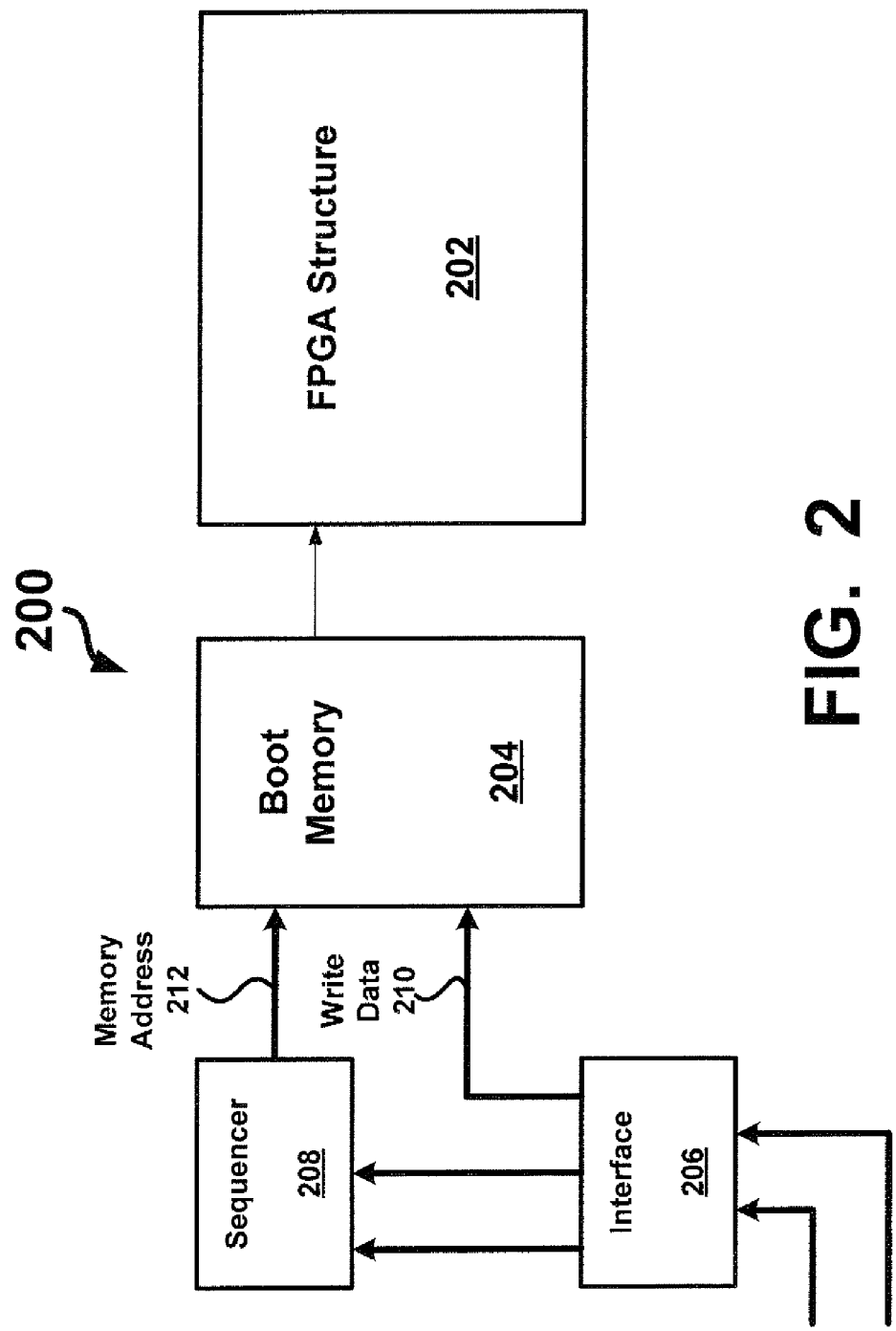
FIG. 2 illustrates an FPGA including a boot memory for programming the FPGA according to an embodiment.

The FPGA 100 may also be programmed using an internally added boot memory, which is described further regarding FIG. 2. The boot memory may provide the lookup tables or functions to the cell memory 104 during booting of the FPGA 100. If the cell memory 104 is a volatile technology, such as SRAM, the boot memory provides the functions whenever the FPGA 100 is powered on. According to an embodiment, if the cell memory 104 is non-volatile, such as the memory technology described above, a boot memory may be used to provide initial lookup tables or functions when the cell memory 104 is unprogrammed. According to this embodiment, after the initial programming, the FPGA 100 may be powered on without booting. The uninitialized memory may be programmed via a serial port using a tester, a processor, or prior to insertion into the printed circuit board (PCB).

The configurable logic 106 may comprise several programmable gates as may be appropriate for a specific application. The configurable logic 106 receives signals from the cell memory 104 for performing various logic functions as designated by a user of the FPGA 100. The configurable logic 106 may be a group of logic gates, or may be a specialized block such as a processor core or a digital signal processor (DSP).

The I/O logic 108 is a block used to provide communication between programmable cells 102 and other macro blocks 101. The FPGA 100 may include several macro blocks 101 and programmable cells 102, and the I/O logic 108, along with other routing components (that are described in FIG. 1C), allow one macro block (e.g., one programmable cell) to communicate with other blocks (or cells).

According to another embodiment, macro blocks 101 other than the programmable cells 102 may be included in the FPGA 100. The macro blocks 101 may include macro blocks with or without memories, or with or without configurable logics. The macro blocks 101 may include various logics that can be used to perform specialized functions for the FPGA 100.

FIG. 1C illustrates one example of signal routing within an FPGA according to an embodiment. The FPGA 100 may include several programmable cells 102 that perform specified logic functions as designated by the FPGA's 100 current program. The programmable cells 102 communicate with one another to facilitate the operation of the logic programs of the FPGA 100. Various routing components are placed between the programmable cells 102 to facilitate this communication.

Switches 110 may include various components, such as multiplexers and AND gates, that direct signals between the programmable cells 102. The switches 110 are connected to other switches 110 and the programmable cells 102 through communication lines 112. The switches 110 may be programmed using, for example, the boot memory described above or another programming technique to designate the proper routing between the programmable cells 102.

The switches 110 may include one or more registers 114 (or other memory elements) that stores switching and routing information for the FPGA 100. The switches 110 can be used to redirect traffic between the programmable cells 102 of the FPGA 100. The routing information may be particular to a program of the FPGA 100, and may be used to implement a desired function of the FPGA 100. For example, the routing information may direct the output of one programmable cell 102 to another programmable cell 102. The second programmable cell may use the information from the first to perform its designated function.

Each switch 110 may store different routing information based on the current program of the FPGA 100. The registers 114 may be conventional registers or registers having a resistivity-sensitive memory element (e.g., a two-terminal memory element) such as those described in U.S. patent application Ser. No. 12/005,685, filed on Dec. 28, 2007, US Published Application No. 2009/0172350, and titled "Non-Volatile Processor Register.", which is herein incorporated by reference for all purposes. If the registers 114 use the memory technology described above, the registers 110 are non-volatile and allow instant-on of the FPGA 100 when used with a non-volatile memory 102. It is understood that other types of routing, including using different switches and different paths, may be used with the various embodiments described herein, and that other macro blocks 101 may be also be including included in the routing scheme of the FPGA 100.

FPGA Implementations

FIG. 2 illustrates an FPGA including a boot memory for programming the FPGA according to an embodiment. An FPGA 200 includes an FPGA structure 202 with additional components. The FPGA structure 202 may be, for example, the FPGA 100 described above, which may include one or more macro blocks (e.g., the programmable cells 102). The FPGA structure 202 may also be any other type of FPGA structure, such as those that are commercially available. The FPGA 200 may be housed on an integrated circuit or in another circuit package.

Connected to the FPGA structure 202 is a boot memory 204. The boot memory 204 stores functions for the FPGA 200 upon booting. The boot memory 204, according to an embodiment, uses the memory technology described above, including a non-volatile rewritable memory having a resistivity-sensitive memory element. According to this embodiment, because the boot memory 204 is non-volatile, the FPGA 200 can be programmed initially and then booted without external support from other devices. Further, according to an embodiment, the memory may have a vertical configuration, which can integrate the boot memory 204 into the FPGA 200 without increasing the physical footprint of the FPGA 200.

An interface 206 and a sequencer 208 provide write data 210 and memory addresses 212 for the boot memory 204, respectively. The interface 206 and the sequencer 208 are used to program or reprogram the boot memory 204. The interface 206 receives write data from external devices such as programming devices, and can be used to receive functions for the FPGA 200. The sequencer 208 provides sequential memory addresses to populate the boot memory 204 with the received functions. According to an embodiment, the interface 206 and the sequencer 208 are used when initially programming the FPGA 200. Since the boot memory 204 is non-volatile, once the FPGA 200 has been programmed, the FPGA 200 can boot without receiving additional functions. The sequencer may also be used to transfer data from the boot memory 204 into the FPGA structure 202 when the FPGA 200 is powered on.

According to another embodiment, the boot memory 204 may also be used as an external memory for the FPGA structure 202. The boot memory 204 may be used to store data, such as look up tables, which are too large to store in the internal memories (e.g., the cell memories 104) of the FPGA structure 202.

Figure 3:
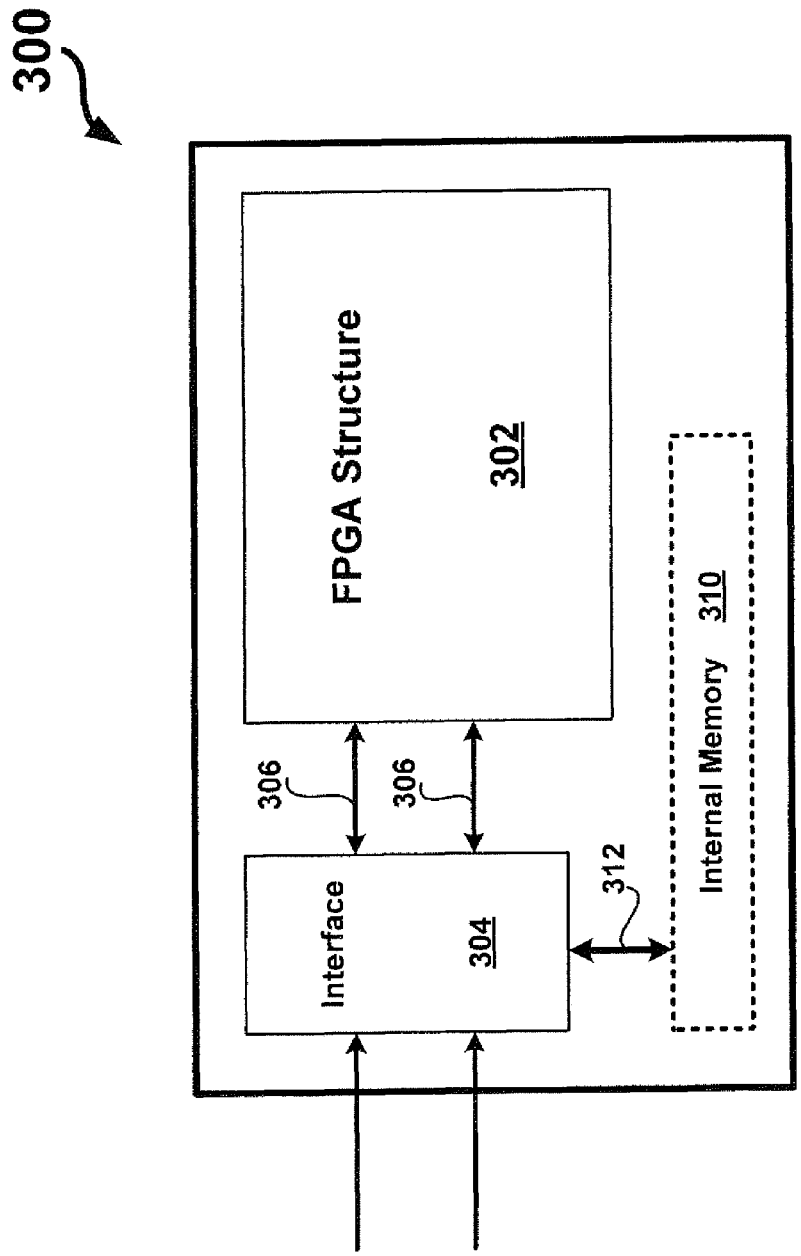
FIG. 3 illustrates an integrated circuit including an FPGA according to an embodiment.

FIG. 3 illustrates an integrated circuit (IC) including an FPGA according to an embodiment. An FPGA 300 includes an FPGA structure 302 (e.g., the FPGA 100). The FPGA 300 also includes an interface 304, which communicates with the FPGA structure 302 over at least one data line 306 (two are depicted). The interface 304 directs data from external devices to the FPGA structure 302. According to an embodiment, the FPGA 300 uses a non-volatile rewritable memory having a resistivity-sensitive memory element. Because the memory technology described above does not need an erase operation prior to a write operation, sequential write accesses of the memory is not needed, and the memory in the FPGA 302 can be accessed using an interface (e.g., interface 304) without a sequencer.

An internal memory 310 may also be added to the FPGA 300 according to another embodiment. The internal memory 310 can be used to store data that is too large to be stored in the FPGA structure 302 (e.g., in the cell memories 104), or that may be needed by several different macro blocks of the FPGA structure 302. The internal memory 310 may also be used as a boot memory if so desired. The internal memory 310 communicates with the FPGA structure over at least one data line 312.

According to an embodiment, the internal memory 310 is internal to an integrated circuit including the FPGA 300 and may be used for memory block(s) for the FPGA 300. The internal memory 310 may be used as program store for imbedded processors or as memory elements in a sequencer design or for look up tables required for some processes. The internal memory 310 may be vertically configured above the FPGA structure 302 (see, e.g., FIG. 4C) and may be loaded through the interface 304. The internal memory 310 may, according to various embodiments, emulate SRAM, DRAM, Flash memory, or read only memory (ROM) in the system environment.

Vertically Configured Memories in FPGAs

Figure 4C:
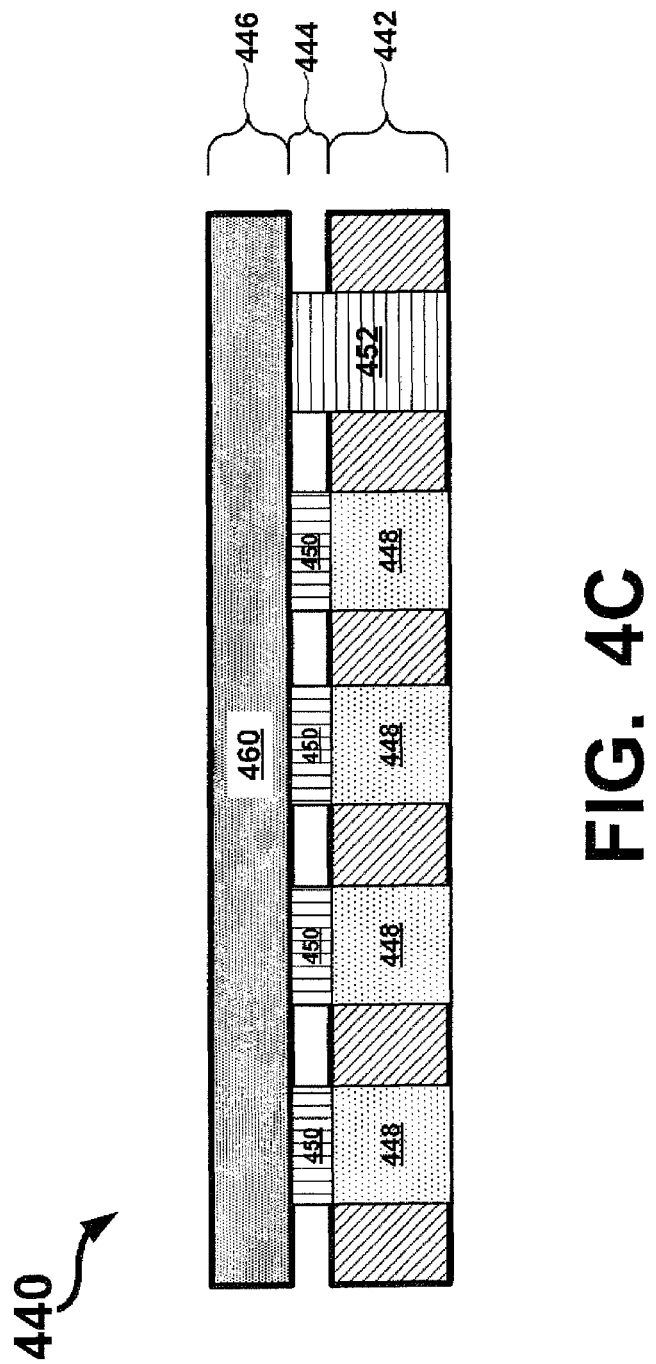
FIG. 4C illustrates an FPGA including vertically configured cell memories and an extended memory according to various embodiments.

FIGS. 4A through 4C illustrate FPGAs including vertically configured memories according to various embodiments. According to an embodiment, the memory technology described above may be configured so that an FPGA including memory of the memory technology and other semiconductor devices may be arranged into multiple vertically configured planes. Vertically configured planes allow for smaller die sizes, since the memory can be placed above the logic components. The configurations shown here may be used with the FPGAs 100, 200, and 300 described above.

An IC may be configured so that logic comprising transistors and other semiconductor devices, such as the logic used to access the memory (i.e., the memory logic), multiplexers, inverters, buffers, and other devices are formed on a semiconductor substrate (e.g., a silicon Si wafer) located in a base (or bottom) logic plane. The memory may then be formed above the logic plane in one or more vertically configured planes. Using these vertical configurations significantly reduces the footprint of ICs created with this memory technology. FIGS. 4A through 4C are examples of various configurations that may be implemented with the FPGAs shown above in FIGS. 1A through 1C, FIG. 2 and FIG. 3.

FIG. 4A illustrates an FPGA using a vertically configured memory. The FPGA 400 is an IC including three planes: a logic (or base) plane 402, a first memory plane 404, and a second memory plane 406. Although two memory planes 404 and 406 are shown, it is understood that any number of memory planes may be used, depending on the footprint of the logic plane 402 and the amount of memory desired for the FPGA 400, as well as other design considerations and application specific requirements. According to an embodiment, the FPGA 400 may be used when a memory technology other than the memory technology described above (e.g., SRAM) is included in the macro blocks (i.e., the cell memory 104) of the FPGA 400. The FPGA 400 may also be used when the cell memories include a non-volatile rewriteable memory including a resistivity-sensitive memory element, according to other embodiments.

The FPGA 400 may be an IC that is constructed using a vertical configuration as described above regarding the disclosed memory technology. The base plane (e.g., the logic plane 402) of an IC using a vertical configuration may contain logic, active circuitry, and semiconductor elements, such as transistors and other components forming logic gates and larger devices. The memory is then formed in one or more planes above the base plane, and controlled by memory logics in the base plane. The memory is connected to the base plane using interconnects such as vias, plugs, contacts, and other interlayer connection structures, for example.

The base plane 402 includes logic 408 for programmable cells and their associated memories (e.g., the configurable logic 106 and the cell memory 104). The memory may be, for example, an SRAM emulation or other emulation of other memory types. According to an embodiment, the logic 408 may include only the configurable logic, as the FPGA 400 may use memory in the memory planes 404 and 406 for implementing the logic function and providing the signals to drive the configurable logic.

The base plane 402 may also include an interface logic 410, a sequencer logic 412, and a memory logic 414. The interface logic 410 and the sequencer logic 412 enable the interface 206 and the sequencer 208, described above. The memory logic 414 includes the components used to access the memory in the memory planes 404 and 406. The memory logic 414 may be connected to the planes 404 and 406 using interconnects such as vias.

The memory planes 404 and 406 may be used as a boot memory such as the boot memory 204, or may, according to some embodiments, be used as the cell memory (e.g., the cell memory 104). The memory planes 404 and 406 may also be used as an internal memory such as the internal memory 310. Any number of memory planes may be used with the FPGA 400 depending on the specific application. Moreover, one or more memory planes (e.g., memory planes 404 and 406) may be partitioned into sub-planes.

FIG. 4B illustrates an FPGA having vertically configured cell memories according to various embodiments. An FPGA 420 includes two planes: a logic plane 422, and a memory plane 424. The logic plane 422 includes several memory logics 426 that include components to control memory in the memory plane 424. The memory plane 424 includes several individual cell memories 428 (e.g., the cell memory 104). The logic plane 422 may also include other logics and active circuitry, such as interface logics or sequencer logics, shown above.

The memory in the memory plane 424 comprises a non-volatile rewriteable memory including a resistivity-sensitive memory element, such as the memory technology described above. The memory plane 424 is divided into several individually accessed cell memories 428 to enable multiple programmable cells for the FPGA 420. Each of the cell memories 428 is individually controlled by one of the memory logics 426. The cell memories 428 may also be divided into additional planes if so desired, or additional planes may be added.

FIG. 4C illustrates an FPGA including vertically configured cell memories and an extended memory according to various embodiments. An FPGA 440 has three planes: a logic plane 442, a first memory plane 444 and a second memory plane 446. The second memory plane 446 is an extended memory 460 that may be used to store additional data, such as look up tables, which may be accessed by multiple programmable cells. The extended memory 460 can be used as additional cell memory for designs that may be too large for the existing cell memories in the first plane 444. The extended memory 460 in the second memory plane 446 may alternatively or additionally be used as a boot memory, similar to the boot memory 204, if so desired, or the extended memory 460 in the second memory plane 446 may perform both functions.

The logic plane 442, like the logic plane 422, includes memory logics 448 that are used to control cell memories 450 in the first memory plane 444. Additionally, the logic plane 442 includes another memory logic 452 that may be used to control the extended memory 460 of the second memory plane 446. The memory logic 452 may be connected to the second memory plane 446 using vias routed through the first memory plane 444.

Although certain vertically configured memories are shown in FIGS. 4A through 4C, it is understood that various other configurations, including more or fewer planes, memory plane(s) partitioned into one or more sub-planes, different locations of specific memories, etc., may be used as desired.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A field programmable gate array (FPGA) comprising:
a first configurable logic block formed in a substrate;
a first memory formed in at least one memory layer overlying the substrate and connected with the first configurable logic block, the first memory comprising non-volatile resistive memory elements, the first memory providing signals to drive the first configurable logic block; and
an interface connected with the first memory and operative to provide write data to the first memory;
a second configurable logic block formed in the substrate and a second memory formed in the at least one memory layer overlying the substrate, the second memory connected with the second configurable logic block, the second memory providing signals to drive the second configurable logic block, and wherein the interface further connects with the second memory and is operative to provide write data to the second memory; and
a third memory formed overlying the substrate and comprising non-volatile resistive memory elements, the third memory providing data accessible to both the first and second configurable logic blocks.

2. A field programmable gate array (FPGA) comprising:
a first configurable logic block formed in a substrate;
a second configurable logic block formed in the substrate;
a first memory formed in at least one memory layer located directly on a surface of the substrate and accessible to both the first and second configurable logic blocks, the first memory comprising non-volatile resistive memory elements, the first memory providing signals to drive the one or both of the first and second configurable logic blocks;
an interface connected with the first memory and operative to provide write data to the first memory; and
further comprising a second memory formed in the at least one memory layer overlying the substrate, wherein the second memory is configured as boot memory.

3. A field programmable gate array (FPGA) comprising:
a first configurable logic block formed in a substrate;
a second configurable logic block formed in the substrate;
a first memory formed in at least one memory layer overlying the substrate and accessible to both the first and second configurable logic blocks, the first memory comprising non-volatile resistive memory elements, the first memory providing signals to drive the one or both of the first and second configurable logic blocks;
an interface connected with the first memory and operative to provide write data to the first memory and at least one memory layer comprises multiple memory layers; and
a second memory formed in the at least one memory layer overlying the substrate, wherein the second memory stores additional information and provides the additional information to the first memory.

* * * * *